(12) United States Patent
Ka (10) Patent No.: US 9,349,486 B2
(45) Date of Patent: May 24, 2016

(54) SEMICONDUCTOR MEMORY APPARATUS INCLUDING AN INTERNAL GENERATION CIRCUIT CONFIGURED TO GENERATE TEST DATA

(71) Applicant: SK hynix Inc., Icheon-si Gyeonggi-do (KR)

(72) Inventor: Dong Yoon Ka, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/564,197

(22) Filed: Dec. 9, 2014

(65) Prior Publication Data
US 2016/0071615 A1   Mar. 10, 2016

(30) Foreign Application Priority Data

Sep. 5, 2014   (KR) .......................... 10-2014-0118841

(51) Int. Cl.
*G11C 7/00* (2006.01)
*G11C 29/02* (2006.01)
*G11C 7/10* (2006.01)
*G11C 7/14* (2006.01)

(52) U.S. Cl.
CPC .............. *G11C 29/022* (2013.01); *G11C 7/106* (2013.01); *G11C 7/1006* (2013.01); *G11C 7/14* (2013.01)

(58) Field of Classification Search
CPC ......... G11C 7/1006; G11C 7/14; G11C 7/062
USPC ............................. 365/189.05, 201, 194, 233
IPC .................... G11C 7/1006,7/14, 7/062
See application file for complete search history.

(56) References Cited

U.S. PATENT DOCUMENTS

| 6,052,329 | A | * | 4/2000 | Nishino | ............... | G11C 7/1051 |
| | | | | | | 365/189.05 |
| 6,061,282 | A | * | 5/2000 | Tamaki | ................... | G11C 29/50 |
| | | | | | | 365/189.05 |
| 8,601,231 | B2 | * | 12/2013 | Mes | ...................... | G11C 7/1039 |
| | | | | | | 365/233.1 |
| 2005/0135167 | A1 | * | 6/2005 | Manabe | ............... | G11C 7/1072 |
| | | | | | | 365/201 |
| 2013/0141994 | A1 | * | 6/2013 | Ito | ............................ | G11C 7/22 |
| | | | | | | 365/193 |

FOREIGN PATENT DOCUMENTS

KR   1020010014921 A   2/2001

* cited by examiner

*Primary Examiner* — Connie Yoha
(74) *Attorney, Agent, or Firm* — William Park & Associates Ltd.

(57) ABSTRACT

A semiconductor memory apparatus includes an internal data generation block configured to generate test data in response to test signals, and output ones of normal data inputted from data input/output pads and the test data as internal data according to a test flag signal; a data storage region configured to receive and store the internal data, and output stored data as cell storage data; a latch block configured to receive and store the cell storage data in response to a data output enable signal, and output stored data as latch data; and a data comparison block configured to compare the test data and the latch data, and generate a test result signal.

18 Claims, 5 Drawing Sheets

SEMICONDUCTOR MEMORY APPARATUS INCLUDING AN INTERNAL GENERATION CIRCUIT CONFIGURED TO GENERATE TEST DATA

CROSS-REFERENCES TO RELATED APPLICATION

The present application claims priority under 35 U.S.C. §119(a) to Korean application number 10-2014-0118841, filed on Sep. 5, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

A semiconductor memory apparatus is configured to store data and output stored data.

It is necessary to test whether a semiconductor memory apparatus normally receives and stores data and normally outputs stored data. After such a test is performed, a semiconductor memory apparatus may be put on the market as a product.

In general, in the case of performing such a test in a semiconductor memory apparatus, external equipment inputs data through data input/output pads of the semiconductor memory apparatus and stores the data, and causes stored data to be outputted through the data input/output pads. The external equipment performs the test by comparing the data inputted to the semiconductor memory apparatus and the data outputted from the semiconductor memory apparatus.

The semiconductor memory apparatus should have not only pads or channels for receiving data from the external equipment but also pads or channels for allowing the semiconductor memory apparatus to enter a test mode.

SUMMARY

In an embodiment, a semiconductor memory apparatus may include an internal data generation block configured to generate test data in response to test signals, and output ones of normal data inputted from data input/output pads and the test data as internal data according to a test flag signal. The semiconductor memory apparatus may include a data storage region configured to receive and store the internal data, and output stored data as cell storage data. The semiconductor memory apparatus may also include a latch block configured to receive and store the cell storage data in response to a data output enable signal, and output stored data as latch data. Further, the semiconductor memory apparatus may include a data comparison block configured to compare the test data and the latch data, and generate a test result signal.

In an embodiment, a semiconductor memory apparatus may include a serial-to-parallel data conversion unit configured to receive normal data of a serial type from a plurality of data input/output pads, convert the normal data of the serial type into parallel data of a parallel type, and output the converted parallel data. The semiconductor memory apparatus may also include a test data generation unit configured to generate test data according to a plurality of test signals. The semiconductor memory apparatus may also include a data selection unit configured to output ones of the parallel data and the test data, as internal data, to a data storage region in response to a test flag signal. Further, the semiconductor memory apparatus may also include a data comparison block configured to compare cell storage data outputted from the data storage region and the test data, and output a test result signal.

In an embodiment, a semiconductor apparatus may include an internal data generation block configured to generate internal data according to first to fourth normal data, first to sixth test signals, and a test flag signal and generate test data according to the first to sixth test signals. The semiconductor apparatus may also include a data storage region configured to receive and store the internal data and output cell storage data. Further, the semiconductor apparatus may include a latch block configured to receive and store the cell storage data and output latch data. In addition, the semiconductor apparatus may include a data comparison block configured to compare the test data and the latch data and generate a test result signal enabled when the test data is identical to the latch data.

DETAILED DESCRIPTION

Hereinafter, a semiconductor memory apparatus will be described below with reference to the accompanying figures through various examples.

Figure 1:
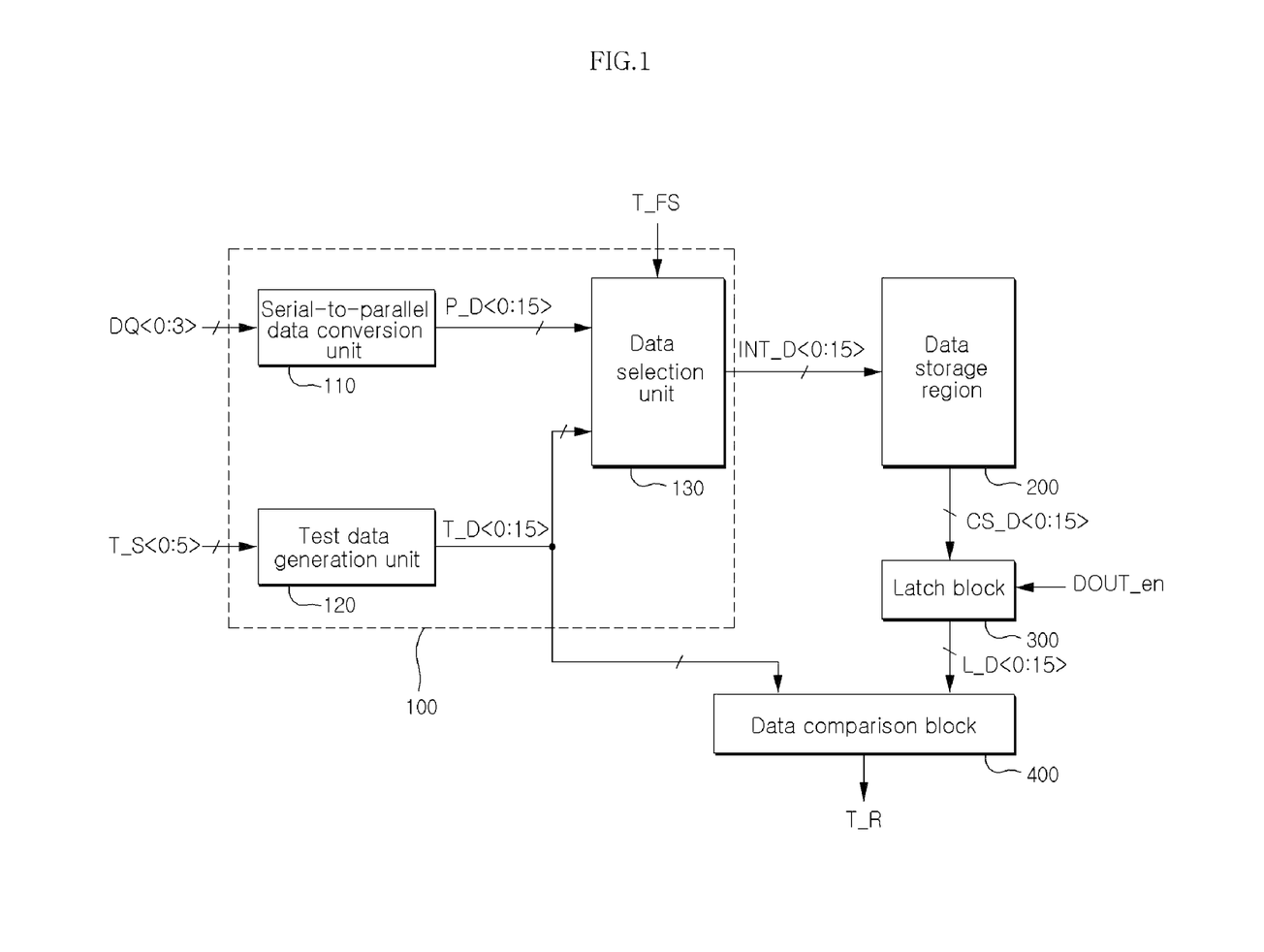
FIG. 1 is a configuration diagram illustrating a representation of an example of a semiconductor memory apparatus in accordance with an embodiment.

Referring to FIG. 1, a semiconductor memory apparatus in an embodiment includes an internal data generation block 100, a data storage region 200, a latch block 300, and a data comparison block 400.

The internal data generation block 100 generates internal data INT_D<0:15> in response to first to fourth normal data DQ<0:3> respectively inputted from first to fourth data input/output pads, first to sixth test signals T_S<0:5> and a test flag signal T_FS. For example, the internal data generation block 100 generates test data T_D<0:15> in response to the first to sixth test signals T_S<0:5>. The internal data generation block 100 generates parallel data P_D<0:15> in response to the first to fourth normal data DQ<0:3>. Further, the internal data generation block 100 outputs ones of the parallel data P_D<0:15> and the test data T_D<0:15>, as the internal data INT_D<0:15>. Each of the first to fourth data input/output pads may transfer 4-bit normal data (DQ<i>, i=0, 1, 2 and 3) aligned in series, to the internal data generation block 100.

The internal data generation block 100 includes a serial-to-parallel data conversion unit 110, a test data generation unit 120, and a data selection unit 130.

The serial-to-parallel data conversion unit 110 converts the first to fourth normal data DQ<0:3> of a serial type, inputted from the 4 data input/output pads, into the parallel data P_D<0:15> of a parallel type. For example, since the serialto-parallel data conversion unit 110 converts the first to fourth normal data DQ<0:3> from the 4 data input/output pads, each as 4 bits of a serial type, into a parallel type, the serial-to-parallel data conversion unit 110 may generate the 16 parallel data P_D<0:15>. While it is described as an example that 4-bit data are successively inputted, that is, 4 normal data are inputted in a serial type, from one data input/output pad, the embodiment is not limited to the number of normal data.

The test data generation unit 120 generates the test data T_D<0:15> in response to the first to sixth test signals T_S<0:5>. For example, the test data generation unit 120 generates the test data T_D<0:15> by decoding a part of the first to sixth test signals T_S<0:5> and latching the remainder according to a decoding result.

The data selection unit 130 outputs ones of the parallel data P_D<0:15> and the test data T_D<0:15>, as the internal data INT_D<0:15>, in response to the test flag signal T_FS. For example, the data selection unit 130 outputs the test data T_D<0:15> as the internal data INT_D<0:15> when the test flag signal T_FS is enabled. In addition, the data selection unit 130 also outputs the parallel data P_D<0:15> as the internal data INT_D<0:15> when the test flag signal T_FS is disabled. The data selection unit 130 may be configured by a multiplexer.

The data storage region 200 receives and stores the internal data INT_D<0:15>, and outputs the stored data as cell storage data CS_D<0:15>. The data storage region 200 may be configured by a plurality of memory cells.

The latch block 300 receives and stores the cell storage data CS_D<0:15> in response to a data output enable signal DOUT_en, and outputs the stored data as latch data L_D<0:15>. For instance, the latch block 300 receives and stores the cell storage data CS_D<0:15> when the data output enable signal DOUT_en is enabled. Further, the latch block 300 outputs the stored data as the latch data L_D<0:15>. The latch block 300 interrupts the operation of receiving and storing the cell storage data CS_D<0:15> when data output enable signal DOUT_en is disabled.

The data comparison block 400 compares the test data T_D<0:15> and the latch data L_D<0:15> and generates a test result signal T_R. The test result signal T_R is outputted to an exterior through a test pad. For example, the data comparison block 400 enables the test result signal T_R when the test data T_D<0:15> and the latch data L_D<0:15> are the same. In addition, the data comparison block 400 disables the test result signal T_R when the test data T_D<0:15> and the latch data L_D<0:15> are different. The data comparison block 400 may be configured by one of an exclusive logic operation circuit, an AND operation circuit and an OR operation circuit.

Figure 2:
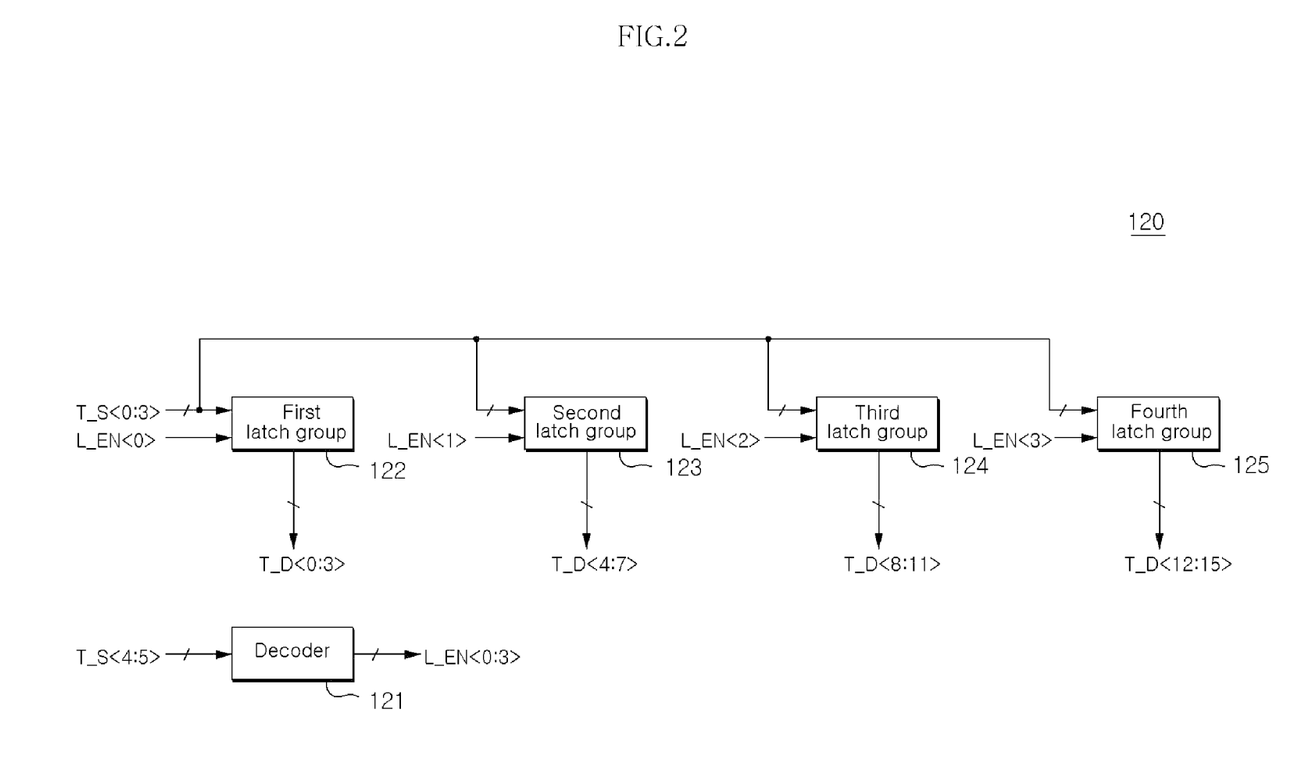
FIG. 2 is a configuration diagram illustrating a representation of an example of the test data generation unit shown in FIG. 1.

Referring to FIG. 2, the test data generation unit 120 includes a decoder 121, and first to fourth latch groups 122, 123, 124 and 125.

The decoder 121 decodes a part T_S<4:5> of the first to sixth test signals T_S<0:5>, and generates first to fourth latch enable signals L_EN<0:3>. For example, the decoder 121 decodes the fifth and sixth test signals T_S<4:5>, and selectively enables the first to fourth latch enable signals L_EN<0:3>. The decoder 121 enables the first latch enable signal L_EN<0> when both the fifth and sixth test signals T_S<4:5> are disabled. In addition, the decoder 121 enables the second latch enable signal L_EN<1> when the fifth test signal T_S<4> is enabled and the sixth test signal T_S<5> is disabled. The decoder 121 enables the third latch enable signal L_EN<2> when the fifth test signal T_S<4> is disabled and the sixth test signal T_S<5> is enabled. The decoder 121 enables the fourth latch enable signal L_EN<3> when both the fifth and sixth test signals T_S<4:5> are enabled.

The first latch group 122 latches the remainder T_S<0:3> of the first to sixth test signals T_S<0:5> according to the first latch enable signal L_EN<0>. Further, the first latch group 122 outputs the latched signals as a part T_D<0:3> of the test data T_D<0:15>. For example, the first latch group 122 latches the first to fourth test signals T_S<0:3> when the first latch enable signal L_EN<0> is enabled. In addition, the first latch group 122 outputs the latched signals as the part T_D<0:3> of the test data T_D<0:15>.

The second latch group 123 latches the remainder T_S<0:3> of the first to sixth test signals T_S<0:5> in response to the second latch enable signal L_EN<1>. In addition, the second latch group 123 outputs the latched signals as a part T_D<4:7> of the test data T_D<0:15>. For example, the second latch group 123 latches the first to fourth test signals T_S<0:3> when the second latch enable signal L_EN<1> is enabled. The second latch group 123 also outputs the latched signals as the part T_D<4:7> of the test data T_D<0:15>.

The third latch group 124 latches the remainder T_S<0:3> of the first to sixth test signals T_S<0:5> in response to the third latch enable signal L_EN<2>. Further, the third latch group 124 outputs the latched signals as a part T_D<8:11> of the test data T_D<0:15>. For example, the third latch group 124 latches the first to fourth test signals T_S<0:3> when the third latch enable signal L_EN<2> is enabled. The third latch group 124 also outputs the latched signals as the part T_D<8:11> of the test data T_D<0:15>.

The fourth latch group 125 latches the remainder T_S<0:3> of the first to sixth test signals T_S<0:5> in response to the fourth latch enable signal L_EN<3>. The fourth latch group 125 also outputs the latched signals as a part T_D<12:15> of the test data T_D<0:15>. For example, the fourth latch group 125 latches the first to fourth test signals T_S<0:3> when the fourth latch enable signal L_EN<3> is enabled. In addition, the fourth latch group 125 outputs the latched signals as the part T_D<12:15> of the test data T_D<0:15>.

The configurations of the first to fourth latch groups 122 to 125 are the same except that the signals inputted and the signals outputted are different. Therefore, the description of the configuration of the first latch group 122 will replace the descriptions of the configurations of the remaining latch groups 123, 124 and 125.

Figure 3:
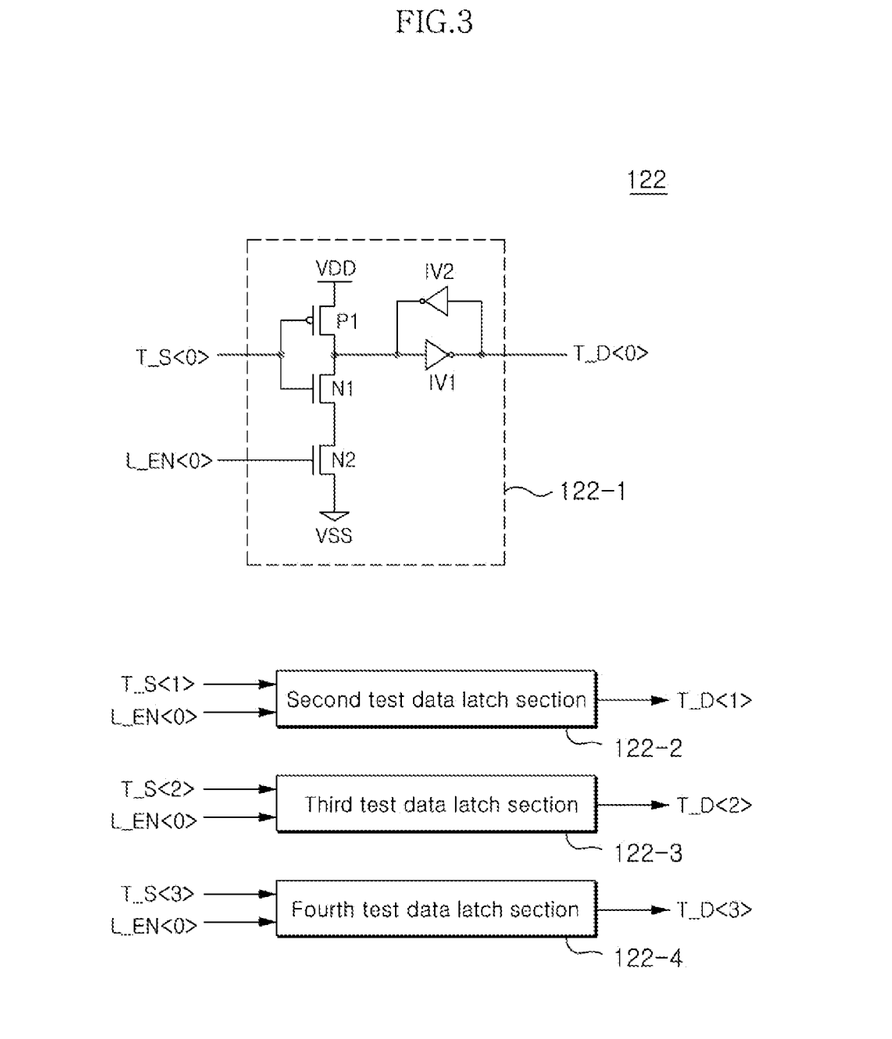
FIG. 3 is a configuration diagram illustrating a representation of an example of the first latch group shown in FIG. 2.

Referring to FIG. 3, the first latch group 122 includes first to fourth test data latch sections 122-1, 122-2, 122-3 and 122-4.

The first test data latch section 122-1 latches the first test signal T_S<0> when the first latch enable signal L_EN<0> is enabled. The first test data latch section 122-1 also outputs the latched signal as a part T_D<0> of the test data T_D<0:15>.

The second test data latch section 122-2 latches the second test signal T_S<1> when the first latch enable signal L_EN<0> is enabled. The second test data latch section 122-2 also outputs the latched signal as a part T_D<1> of the test data T_D<0:15>.

The third test data latch section 122-3 latches the third test signal T_S<2> when the first latch enable signal L_EN<0> is enabled. The third test data latch section 122-3 also outputs the latched signal as a part T_D<2> of the test data T_D<0:15>.

The fourth test data latch section 122-4 latches the fourth test signal T_S<3> when the first latch enable signal L_EN<0> is enabled. The fourth test data latch section 122-4 also outputs the latched signal as a part T_D<3> of the test data T_D<0:15>.

The configurations of the first to fourth test data latch sections 122-1, 122-2, 122-3 and 122-4 are the same except that the signals inputted and the signals outputted are different. Therefore, the description of the configuration of the first test data latch section 122-1 will replace the descriptions of the configurations of the second to fourth test data latch sections 122-2, 122-3 and 122-4.

The first test data latch section 122-1 includes first to third transistors P1, N1 and N2, and first and second inverters IV1 and IV2. The first transistor P1 has the gate which receives the first test signal T_S<0>, and the source which is applied with an external voltage VDD. The second transistor N1 has the gate which receives the first test signal T_S<0>, and the drain to which the drain of the first transistor P1 is electrically coupled. The third transistor N2 has the gate which receives the first latch enable signal L_EN<0>. The third transistor N2 also has the drain to which the source of the second transistor N1 is electrically coupled, and the source to which a ground terminal VSS is electrically coupled. The first inverter IV1 has an input terminal to which a node electrically coupled with the first and second transistors P1 and N1 is electrically coupled. The first inverter IV1 also has an output terminal from which the test data T_D<0> is outputted. The second inverter IV2 has an input terminal to which the output terminal of the first inverter IV1 is electrically coupled. The second inverter IV2 also has an output terminal to which the input terminal of the first inverter IV1 is electrically coupled.

Figure 4:
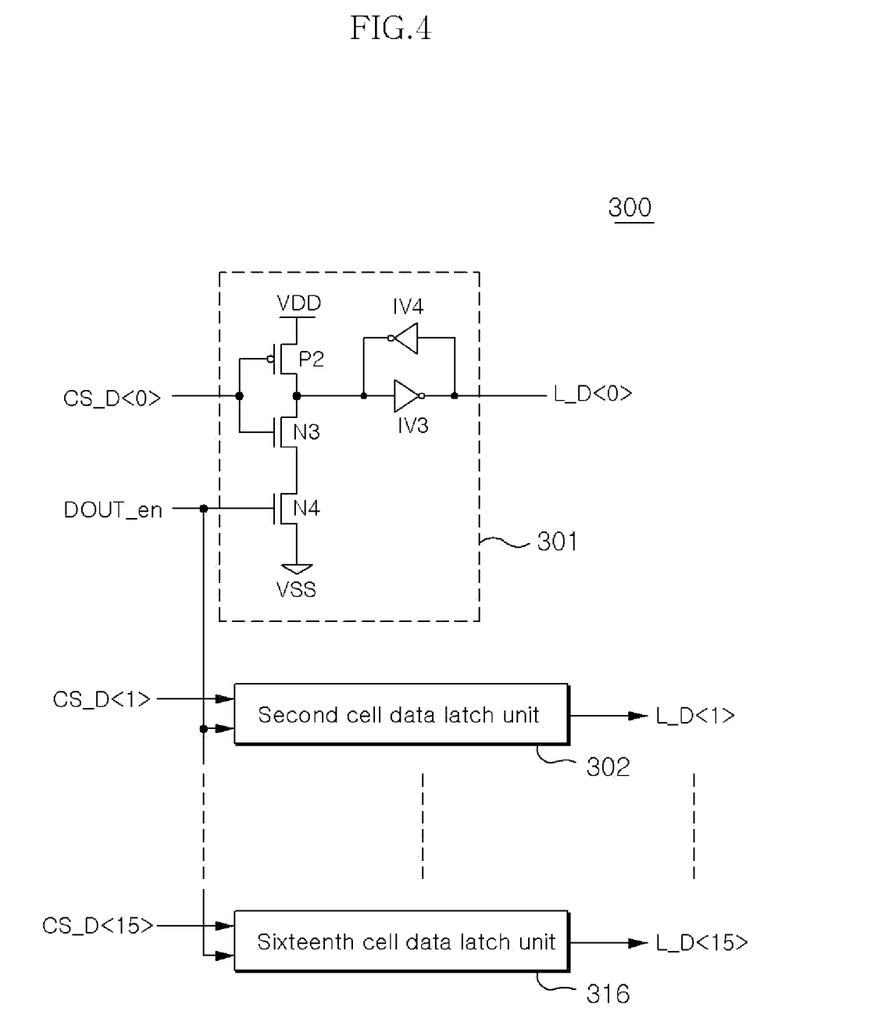
FIG. 4 is a configuration diagram illustrating a representation of an example of the latch unit shown in FIG. 1.

Referring to FIG. 4, the latch block 300 of FIG. 1 includes first to sixteenth cell data latch units 301 to 316.

The first to sixteenth cell data latch units 301 to 316 latch the cell storage data CS_D<0:15> inputted when the data output enable signal DOUT_en is enabled, and output the latch data L_D<0:15>.

The configurations of the first to sixteenth cell data latch units 301 to 316 are the same except that the signals inputted and the signals outputted are different. Therefore, the description of the configuration of the first cell data latch unit 301 will replace the descriptions of the configurations of the second to sixteenth cell data latch units 302 to 316.

The first cell data latch unit 301 includes fourth to sixth transistors P2, N3 and N4, and third and fourth inverters IV3 and IV4. The fourth transistor P2 has the gate which receives the cell storage data CS_D<0>. The fourth transistor P2 also has the source which is applied with the external voltage VDD. The fifth transistor N3 has the gate which receives the cell storage data CS_D<0>. The fifth transistor N3 also has the drain to which the drain of the fourth transistor P2 is electrically coupled. The sixth transistor N4 has the gate which receives the data output enable signal DOUT_en. The sixth transistor N4 also has the drain to which the source of the fifth transistor N3 is electrically coupled, and the source to which the ground terminal VSS is electrically coupled. The third inverter IV3 has an input terminal to which a node electrically coupled with the fourth and fifth transistors P2 and N3 is electrically coupled. The third inverter IV3 also has an output terminal from which the latch data L_D<0> is outputted. The fourth inverter IV4 has an input terminal to which the output terminal of the third inverter IV3 is electrically coupled. Further, the fourth inverter IV4 has an output terminal to which the input terminal of the third inverter IV3 is electrically coupled.

Operations of the semiconductor memory apparatus in accordance with an embodiment, configured as mentioned above, will be described below.

In a normal operation, signals to be provided in the test are all disabled. For example, in the normal operation, the first to sixth test signals T_S<0:5> and the test flag signal T_FS are all disabled.

Therefore, the first to fourth normal data DQ<0:3> of a serial type, inputted from the data input/output pads, are converted into the parallel data P_D<0:15> of a parallel type, through the serial-to-parallel data conversion unit 110.

The data selection unit 130 outputs the parallel data P_D<0:15> as the internal data INT_D<0:15> in response to the test flag signal T_FS which is disabled.

The data storage region 200 receives and stores the internal data INT_D<0:15>.

In the normal operation, the semiconductor memory apparatus performs a data storage operation by converting the data of a serial type inputted from the data input/output pads, into the data of a parallel type, and storing the converted data.

In the test, the test data generation unit 120 generates the test data T_D<0:15> in response to the first to sixth test signals T_S<0:5>. Detailed descriptions will be made with reference to FIG. 2.

The decoder 121 decodes the fifth and sixth test signals T_S<4:5> among the first to sixth test signals T_S<0:5>. The decoder 121 also generates the first to fourth latch enable signals L_EN<0:3>. For example, the decoder 121 decodes the fifth and sixth test signals T_S<4:5>. In addition, the decoder 121 enables one of the first to fourth latch enable signals L_EN<0:3>.

If the first latch enable signal L_EN<0> is enabled, the first latch group 122 latches the first to fourth test signals T_S<0:3> and outputs the part T_D<0:3> of the test data T_D<0:15>.

If the second latch enable signal L_EN<1> is enabled, the second latch group 123 latches the first to fourth test signals T_S<0:3> and outputs the part T_D<4:7> of the test data T_D<0:15>.

If the third latch enable signal L_EN<2> is enabled, the third latch group 124 latches the first to fourth test signals T_S<0:3> and also outputs the part T_D<8:11> of the test data T_D<0:15>.

If the fourth latch enable signal L_EN<3> is enabled, the fourth latch group 125 latches the first to fourth test signals T_S<0:3> and additionally outputs the part T_D<12:15> of the test data T_D<0:15>.

The test data generation unit 120 receives the fifth and sixth test signals T_S<4:5> 4 times to enable the respective first to fourth latch enable signals L_EN<0:3> 1 time. The first to fourth test signals T_S<0:3> may be inputted at levels desired by a tester each time the fifth and sixth test signals T_S<4:5> are inputted to the test data generation unit 120.

The outputs of the first to fourth latch groups 122, 123, 124 and 125 become the test data T_D<0:15>.

The test data T_D<0:15> generated are outputted as the internal data INT<0:15> by the data selection unit 130. Since the data selection unit 130 receives the test flag signal T_FS which is enabled, the data selection unit 130 outputs the test data T_D<0:15> as the internal data INT<0:15>.

The internal data INT<0:15> are stored in the data storage region 200.

The data storage region 200 outputs the stored internal data INT_D<0:15> as the cell storage data CS_D<0:15>.

The latch block 300 receives and latches the cell storage data CS_D<0:15> when the data output enable signal DOUT_en is enabled. The latch block 300 also outputs the latched data as the latch data L_D<0:15>. In FIG. 4, the latch block 300 includes the first to sixteenth cell data latch units 301 to 316. The respective cell data latch units 301 to 316 latch the cell storage data (CS_D<L>, L=a natural number of 0 to 15) inputted when the data output enable signal DOUT_en is enabled. The respective cell data latch units 301 to 316 also output the latch data L_D<0:15>.

The data comparison block 400 compares the test data T_D<0:15> and the latch data L_D<0:15>. The data comparison block 400 also generates the test result signal T_R.

The data comparison block 400 enables the test result signal T_R when the test data T_D<0:15> and the latch data L_D<0:15> are the same. The data comparison block 400 also outputs the enabled test result signal T_R to the test pad. The data comparison block 400 disables the test result signal T_R when the test data T_D<0:15> and the latch data L_D<0:15> are different. Further, the data comparison block 400 also outputs the disabled test result signal T_R to the test pad.

Figure 5:
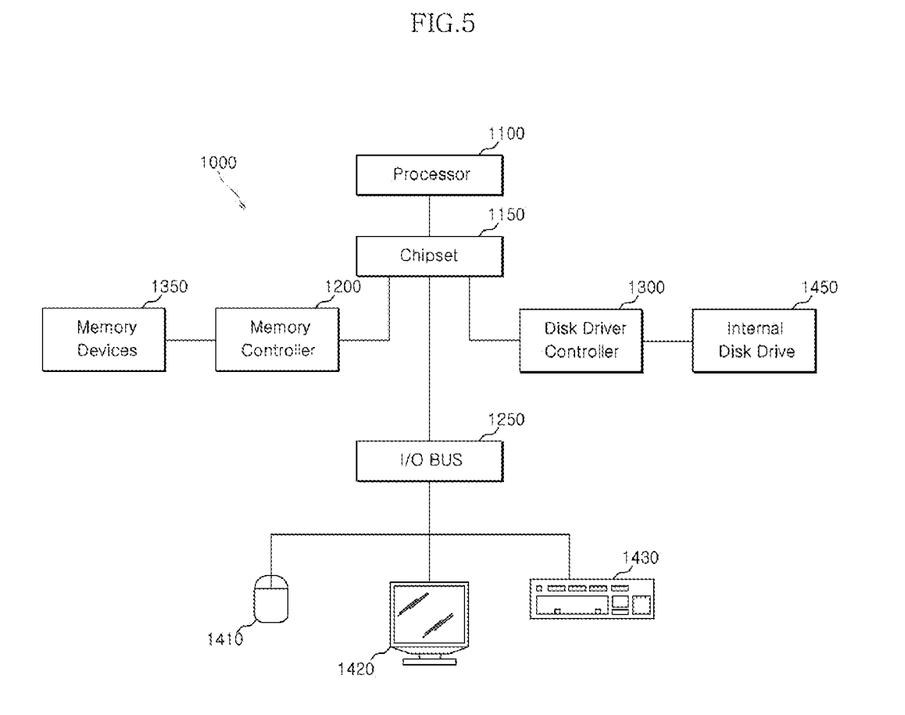
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor memory apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above descriptions, in the semiconductor memory apparatus in accordance with an embodiment, in a test, by generating test data with levels desired by a tester, through using test signals, storing the test data in a data storage region, and comparing the data stored in the data storage region with the test data, it is possible to test whether the data storage region normally stores data. In addition, in the semiconductor memory apparatus in accordance with an embodiment, when performing such a test, the test is performed using only the test signals inputted to the semiconductor memory apparatus in the test, whereby a time and a cost required for performing the test may be shortened and reduced accordingly.

While various embodiments have been described above, it will be understood to those skilled in the art that the embodiments described are by way of examples only. Accordingly, the semiconductor memory apparatus described should not be limited based on the described embodiments above.

What is claimed is:

1. A semiconductor memory apparatus comprising:
   an internal data generation block configured to generate test data in response to test signals, and output ones of normal data inputted from data input/output pads and the test data as internal data according to a test flag signal;
   a data storage region configured to receive and store the internal data, and output stored data as cell storage data;
   a latch block configured to receive and store the cell storage data in response to a data output enable signal, and output stored data as latch data; and
   a data comparison block configured to compare the test data and the latch data, and generate a test result signal,
   wherein the internal data generation block comprises:
   a serial-to-parallel data conversion unit configured to convert the normal data of a serial type inputted from the data input/output pads, into parallel data of a parallel type;
   a test data generation unit configured to generate the test data of the parallel type in response to test signals; and
   a data selection unit configured to output the parallel data or the test data as the internal data in response to the test flag signal.

2. The semiconductor memory apparatus according to claim 1, wherein the test data generation unit comprises:
   a decoder configured to decode a part of the test signals, and generate a latch enable signal; and
   a latch group configured to latch a remainder excluding the test signals in response to the latch enable signal.

3. The semiconductor memory apparatus according to claim 2, wherein the latch group comprises a plurality of test data latch sections configured to latch a remainder of the test signals in response to the latch enable signal.

4. The semiconductor memory apparatus according to claim 1, wherein the latch block comprises a plurality of cell data latch units configured to latch the cell storage data in response to the data output enable signal.

5. The semiconductor memory apparatus according to claim 1, wherein the data comparison block enables the test result signal when the test data and the latch data are identical and disables the test result signal when the test data and the latch data are different, and the test result signal is outputted through a test pad.

6. A semiconductor memory apparatus comprising:
   a serial-to-parallel data conversion unit configured to receive normal data of a serial type from a plurality of data input/output pads, convert the normal data of the serial type into parallel data of a parallel type, and output the converted parallel data;
   a test data generation unit configured to generate test data according to a plurality of test signals;
   a data selection unit configured to output ones of the parallel data and the test data, as internal data, to a data storage region in response to a test flag signal; and
   a data comparison block configured to compare cell storage data outputted from the data storage region and the test data, and output a test result signal,
   wherein the test data generation unit comprises:
   a decoder configured to decode a part of the plurality of test signals, and generate a plurality of latch enable signals; and
   a plurality of latch groups configured to store a remainder of the plurality of test signals in response to the plurality of latch enable signals.

7. The semiconductor memory apparatus according to claim 6,
   wherein the plurality of test signals comprises a first test signal and a second test signal, wherein the plurality of latch enable signals comprise a first latch enable signal, a second latch enable signal, a third latch enable signal, and a fourth latch enable signal, and wherein the decoder decodes the first and second test signals, and enables at least one of the first to fourth latch enable signals.

8. The semiconductor memory apparatus according to claim 7, wherein the remainder of the plurality of test signals comprises a third test signal, a fourth test signal, a fifth test signal, and a sixth test signal, wherein the plurality of latch groups comprise a first latch group, a second latch group, a third latch group, and a fourth latch group, wherein the first latch group latches the third to sixth test signals in response to the first latch enable signal, wherein the second latch group latches the third to sixth test signals in response to the second latch enable signal, wherein the third latch group latches the third to sixth test signals in response to the third latch enable signal, and wherein the fourth latch group latches the third to sixth test signals in response to the fourth latch enable signal.

9. The semiconductor memory apparatus according to claim 8, wherein each of the first to fourth latch groups comprises 4 test data latch sections configured to latch the third to sixth test signals when a latch enable signal inputted thereto is enabled.

10. The semiconductor memory apparatus according to claim 6, wherein the data selection unit outputs the test data as the internal data when the test flag signal is enabled, and outputs the parallel data as the internal data when the test flag signal is disabled.

11. A semiconductor memory apparatus comprising:

an internal data generation block configured to generate internal data according to first to fourth normal data, first to sixth test signals, and a test flag signal and generate test data according to the first to sixth test signals;

a data storage region configured to receive and store the internal data and output cell storage data;

a latch block configured to receive and store the cell storage data and output latch data; and a data comparison block configured to compare the test data and the latch data and generate a test result signal enabled when the test data is identical to the latch data.

12. The semiconductor memory apparatus according to claim 11, further comprising:

a data selection unit configured to receive the test flag signal and output the test data as the internal data.

13. The semiconductor memory apparatus according to claim 11, wherein the data comparison block outputs a disabled test result signal when the test data is different from the latch data.

14. The semiconductor memory apparatus according to claim 11, wherein the latch block outputs the latch data according to a data output enable signal.

15. The semiconductor memory apparatus according to claim 11, wherein the internal data generation block is configured to generate parallel data according to the first to fourth normal data, and output ones of the parallel data and the test data as the internal data.

16. The semiconductor memory apparatus according to claim 11, further comprising:

a test data generation unit configured to generate the test data by decoding a part of the first to sixth test signals.

17. The semiconductor memory apparatus according to claim 14, wherein the latch block is configured to interrupt the receiving and storing of the cell storage data when the data output enable signal is disabled.

18. The semiconductor memory apparatus according to claim 11, further comprising:

a decoder configured to decode a part of the first to sixth test signals and generate first to fourth latch enable signals.

* * * * *